(12) United States Patent
White et al.

(10) Patent No.: US 6,204,088 B1
(45) Date of Patent: Mar. 20, 2001

(54) GLUE-FREE BACKSIDE ILLUMINATED PHOTODIODE APPARATUS AND FABRICATION PROCESS

(75) Inventors: William J. White, Chelmsford; Miriam F. Young, Dorchester, both of MA (US)

(73) Assignee: Lockheed Martin Corp., Bethesda, MD (US)

( * ) Notice: Subject to any disclaimer, the term of this patent is extended or adjusted under 35 U.S.C. 154(b) by 0 days.

(21) Appl. No.: 06/636,898

(22) Filed: Aug. 2, 1984

(51) Int. Cl.[7] .................................................. H01L 21/00

(52) U.S. Cl. ..................... 438/57; 250/338.4; 329/370

(58) Field of Search ........................... 156/629, 630, 156/655, 656, 659.1, 664; 250/211 J, 332; 357/16, 30, 61

(56) References Cited

U.S. PATENT DOCUMENTS

| | | | |
|---|---|---|---|
| 3,889,284 | * 6/1975 | Schiel | 357/16 |
| 4,029,962 | * 6/1977 | Chapman | 357/30 |
| 4,053,919 | * 10/1977 | Andrews, II et al. | 357/16 |
| 4,377,436 | * 3/1983 | Donnelly et al. | 156/657 |
| 4,447,291 | * 5/1984 | Schulte | 156/655 |
| 4,465,565 | * 8/1984 | Zanio | 250/332 |

* cited by examiner

Primary Examiner—Charles T. Jordan
Assistant Examiner—Denise P Buckly
(74) Attorney, Agent, or Firm—David W. Gomes

(57) ABSTRACT

Apparatus and method for fabricating a backside illuminated photodiode array is described which does not use epoxy, and therefore has better transmission characteristics. The method uses indium or other coldweldable metal to fasten the detectors to the transmissive substrate. Because the indium is opaque in the waveband of detector sensitivity, it also forms an optical mask for each detector element.

11 Claims, 1 Drawing Sheet

GLUE-FREE BACKSIDE ILLUMINATED PHOTODIODE APPARATUS AND FABRICATION PROCESS

BACKGROUND OF THE INVENTION

The apparatus and process of the present invention relates generally to infrared detector elements, and more specifically to the fabrication techniques used to achieve closely packed one- or two-dimensional photoconductive mercury cadmium telluride infrared detector arrays.

Mercury cadmium telluride (HgCdTe) detectors are commonly used in scanning infrared optical systems. These detectors are constructed in a variety of configurations, for example in front-side illuminated photoconductive arrays or in backside illuminated photodiode arrays. In the past, these system designs have typically required close spacing of the detector elements in only one dimension.

Close spacing has been accomplished in front-side illuminated photoconductive arrays by detector fabrication techniques which use photoresist to define the detector edges in combination with either acid etching or ion beam milling to remove the extraneous detector material. In some systems, close spacing is required in two directions. However, in these cases it is desirable to use approaches that are as similar to those used in one dimensional arrays as possible.

For example, in one well-known fabrication technique, i.e., the "Z" technology, individual detector elements are formed (usually with nearly standard processing) on the edges of thin substrates which are then placed side by side to achieve close packing. Prior to stacking the arrays side by side, the detector electrode material is selectively deposited over the detector, epoxy and substrate edges, thus providing a detector electrical contact and defining the detector active area.

However, close spacing as required by recent optical system designs (i.e., 0.001 to 0.002 inches between detector active areas) are difficult to achieve using the Z technology. First, the Z technology requires a certain minimum detector spacing in order to bring the detector electrode up over the etched or milled substrate/detector edge. Second, this requires cutting through the glue bond between detector and substrate which invariably results in erosion of the detector active area. Finally, the process of contacting the detector to the underlying circuit board conductive pad requires additional space between detectors. These three aspects of the Z technology (bringing the contact up over the detector edge, glue cutting and contacting) require so much space between detectors that linear packing densities greater than ninety percent (90%) are difficult to achieve using detector elements placed 0.010 inch center-to-center.

In photodiode backside illuminated HgCdTe arrays, two-dimensional packing of detectors has been more easily accomplished, but performance has suffered as a result of the fabrication technique used. In one fabrication technique, a window glass material, such as IRTRAN manufactured by Eastman Kodak Co., is etched or milled to form a checkerboard pattern of raised square plateaus, where each plateau is separated by an etched area on all four sides. A metalization is deposited in the etched areas such that transmission is limited to the raised areas.

This window is then epoxied to a HgCdTe detector substrate which is subsequently lapped, polished, masked and doped to form a photodiode array. The detector active areas are formed over the plateaus of the window in order to maximize optical transmission to the detectors through the epoxy. While both close packing and masking are achieved with this technique, transmission is reduced unpredictably by the thickness of epoxy between the raised plateaus and the HgCdTe substrate.

It is, accordingly, a primary object of the present invention to provide an apparatus and method for fabricating a backside illuminated detector array which may be used to construct detector array assemblies which are closely packed in either one or both directions, and have better transmission and performance characteristics.

SUMMARY OF THE INVENTION

The above and other objects of the present invention are achieved by constructing a backside contact mosaic detector array in which a formed layer of indium or other coldweldable material acts as both a mechanical fastener, attaching the detector material to the transmissive substrate, and a mask, thereby limiting stray radiation from striking each detector surface.

BRIEF DESCRIPTION OF THE DRAWINGS

The objects of the present invention are achieved in the illustrative embodiments as described with respect to the Figures in which.

DETAILED DESCRIPTION OF THE PREFERRED EMBODIMENT(S)

Figure 2A:
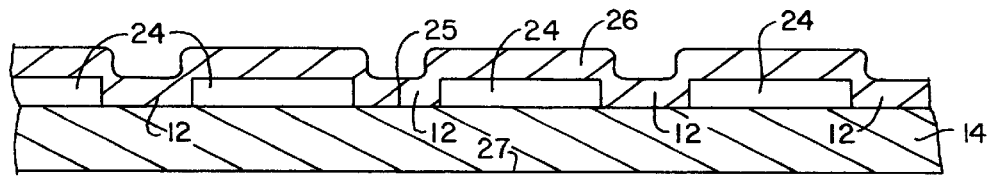
FIGS. 2A, 2B, 2D and 2E show cross-sections through the backside illuminated mosaic detector array of the present invention during progressive stages of the fabrication process.

Referring to FIGS. 2A, 2B, 2C, 2D and 2E, the method of fabrication of the mosiac detector array of the present invention is as follows. A semiconductor crystal substrate 14 is prepared by lapping and etching until each side of the substrate or wafer is essentially parallel and unscratched. The substrate may be made, for example, from mercury cadmium telluride (HgCdTe), or some other suitable material. As shown in FIG. 2A, a photoresist pattern 24, which includes a matrix of square patterns, is formed on surface 25. Each square is positioned on substrate 14 to define the opening in an optical mask for each photodiode detector region 16 which will ultimately be formed in substrate 14.

Figure 2B:
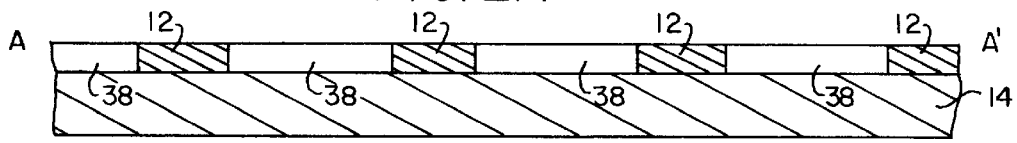
Figure 2C:
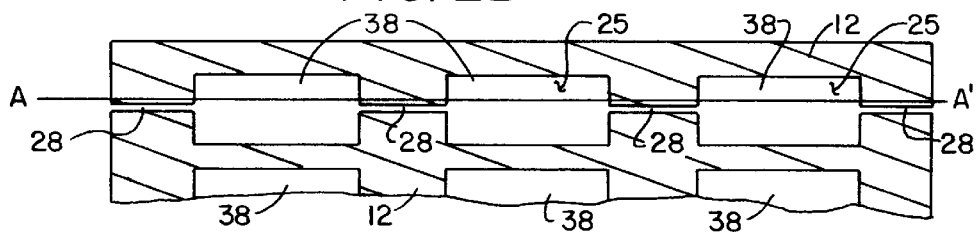
FIG. 2C is a plan view of FIG. 2B.

As shown in FIG. 2A, a thin film 26 of coldweldable metal, such as indium, is deposited over photoresist pattern 24 and the remaining uncovered portions of surface 25 of substrate 14. The photoresist 24 is then dissolved, thereby removing the entire pattern 24 and the portion of metal deposition 26 deposited thereon. As shown in FIG. 2B, this process leaves holes 38 in the pattern of metal deposition 12. The photo process then leaves a pattern of metal deposition 12 having the form shown in FIGS. 2B and 2C. FIG. 2B shows a cross-section along line A—A' as shown in the plan view of FIG. 2C. A series of channels 28 may be formed in the pattern of metal deposition 12, in order to form an open passage between each hole 38 and the exterior of substrate 14 along surface 25.

Figure 2D:
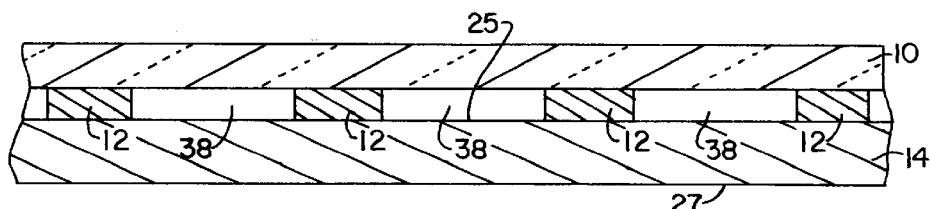

An optical window 10 is prepared using well-known lapping, polishing and etching techniques. This window may be made from a glass substrate material, such as IRTRAN, for example. If desired, window 10 may be prepared with a metal pattern matching pattern 12 on substrate 14. As shown in FIG. 2D, window 10 and pattern 12 are pressed together, thereby coldwelding substrate 14 and window 10. Some amount of pressure, and, if necessary, some heat, may be used to cause adherence without damaging substrate 14. For example, approximately 300 pounds per square inch pressure is required to cause adherence in indium, which is well below that pressure that causes damage to a substrate 14 comprising HgCdTe.

In alternate embodiments, deformable pattern 12 may comprise gold, silver, indium or metal filled epoxy. In addition, it should be noted that the thicknesses of pattern 12 may vary significantly, depending on the material used and the optical masking properties desired.

It is understood that the square patterns of photoresist 24 and the resulting pattern 12 and configuration of holes 38 and channels 28 might be arranged and shaped differently, depending on the shape and placement of each desired detector element 16 in the finished device. In each case, however, the shape and lateral extent of pattern 12 is designed to provide an optical mask for each detector element 16, as well as to provide an epoxy free connection between substrate 14 and window 10.

Figure 2E:
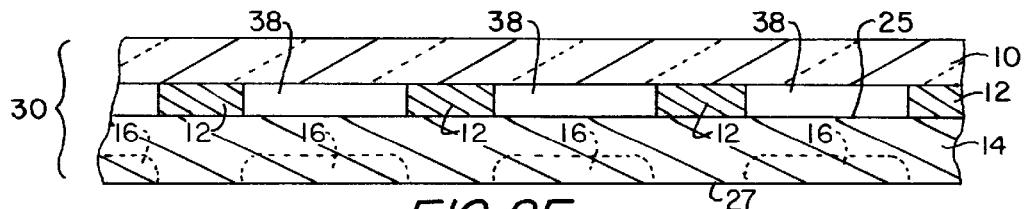

In the final processing steps, surface 27 of substrate 14 is prepared for photodiode delineation by the well-known processes of lapping, polishing and etching. If necessary, a removable epoxy, or other fastening means, not shown, may be placed around the periphery of substrate 14 to prevent damage and movement of substrate 14 relative to window 10 during the final steps of finishing. The areas for detector elements 16 are then delineated, by doping or other well-known processes, in substrate 14 opposite holes 38, as shown in FIG. 2E.

Figure 1:
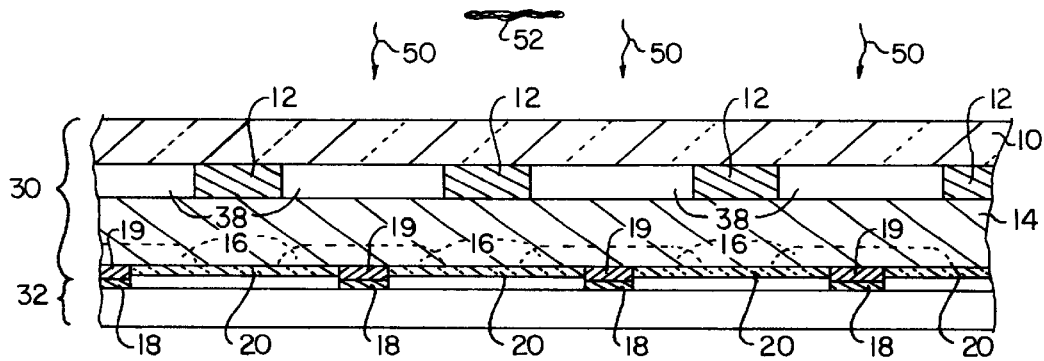
FIG. 1 shows cross-sections through a backside illuminated photodiode mosiac detector array of the present invention.

Referring to FIG. 1, the finished photodiode array 30 may then be attached to a readout device, such as a charged coupled device (CCD) 32 as shown. CCD 32 may comprise metal contacts 18, each in contact with a photodiode contact 19. Optical information from the scene of interest 52, as shown by arrows 50, travels through window 10, through holes 38 and substrate 14 in order to backside-illuminate detector elements, such as photodiodes 16.

The use of pattern 12 of coldweldable material thus provides a dual function, both the fastening material between window 10 and substrate 14 and the optical mask of each photodiode element 16. This offers significant transmission improvements over present fabrication methods and devices which use a partially nontransmitting epoxy to fasten substrate 14 to window 10.

Having described the invention, what is claimed as new and novel and for which it is desired to secure Letters Patent is:

1. A method for fabricating a backside contacted photodiode detector assembly from a first substrate, said assembly for operation at a desired waveband, said first substrate having a first surface and a second surface, said method comprising the steps of:
    A. depositing a pattern of coldweldable metal on said first surface of said first substrate, said pattern having at least one hole, thereby exposing said first surface of said first substrate at said at least one hole, wherein said coldweldable metal is substantially opaque at said desired waveband;
    B. coldwelding a second substrate to said pattern of coldweldable metal, wherein said second substrate is substantially transmissive at said desired waveband; and
    C. forming detector elements substantially on said second surface of said first substrate at positions substantially opposite said at least one hole in said pattern of coldweldable metal.

2. A method for fabricating as in claim 1 wherein said step of depositing comprises the steps of:
    A. depositing a second pattern of photoresist on said first surface of said first substrate, wherein said second pattern covers said first surface over the desired position of said holes;
    B. depositing a layer of said coldweldable metal over said second pattern and said exposed portions of said first surface; and
    C. removing said second pattern of said photoresist, thereby removing a portion of said layer of coldweldable metal in order to leave said first pattern of coldweldable metal on said first surface of said first substrate.

3. A method for fabricating as in claim 1 wherein said first pattern further comprises one or more channels connecting said holes.

4. A method for fabricating as in claim 1 wherein said coldweldable metal is indium.

5. A method as in claim 1 wherein said first substrate is HgCdTe.

6. A method as in claim 1 wherein said second substrate is a glass-like material.

7. A backside contacted photodiode detector article for operation at a desired waveband, said article comprising:
    A. a first substrate, said first substrate having a first surface and a second surface;
    B. a pattern of metal coldwelded on said first surface of said first substrate, said pattern having at least one hole, thereby exposing said first surface of said first substrate at said at least one hole, wherein said coldwelded metal is substantially opaque at said desired waveband;
    C. a second substrate coldwelded to said pattern of coldwelded metal, wherein said second substrate is substantially transmissive at said desired waveband; and
    D. detector elements formed substantially on said second surface of said first substrate at positions substantially opposite said at least one hole in said pattern of coldwelded metal.

8. Apparatus as in claim 7 wherein said first pattern further comprises one or more channels connecting said holes.

9. Apparatus as in claim 7 wherein said coldwelded metal is indium.

10. Apparatus as in claim 7 wherein said first substrate is HgCdTe.

11. Apparatus as in claim 7 wherein said second substrate is a glass-like material.

* * * * *